(12) United States Patent
Roberts et al.

(10) Patent No.: US 6,356,981 B1
(45) Date of Patent: Mar. 12, 2002

(54) METHOD AND APPARATUS FOR PRESERVING DATA COHERENCY IN A DOUBLE DATA RATE SRAM

(75) Inventors: Alan L. Roberts, Jericho; Reid A. Wistort, Westford, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/250,772

(22) Filed: Feb. 12, 1999

(51) Int. Cl.[7] .............................................. G06F 12/00
(52) U.S. Cl. ........................ 711/141; 711/104; 711/163; 711/167
(58) Field of Search ................................ 711/105, 167, 711/104, 163, 141; 365/233

(56) References Cited

U.S. PATENT DOCUMENTS

| | | |
|---|---|---|
| 4,905,188 A | 2/1990 | Chuang et al. |
| 5,029,070 A | 7/1991 | McCarthy et al. |
| 5,371,874 A | 12/1994 | Chinnaswamy et al. |
| 5,432,918 A | 7/1995 | Stamm |
| 5,634,073 A | 5/1997 | Collins et al. |
| 5,666,515 A | 9/1997 | White et al. |
| 5,692,200 A | 11/1997 | Carlson et al. |
| 5,717,653 A | 2/1998 | Suzuki |
| 5,737,759 A | 4/1998 | Merchant |
| 5,748,558 A | 5/1998 | Suzuki |
| 5,812,490 A | * 9/1998 | Tsukude ...................... 365/233 |
| 5,920,511 A | * 7/1999 | Lee et al. ............... 365/189.05 |
| 5,950,223 A | * 9/1999 | Chiang et al. ............... 711/105 |
| 6,061,292 A | * 5/2000 | Su et al. .................. 365/230.06 |
| 6,081,477 A | * 6/2000 | Li et al. ...................... 365/233 |
| 6,115,320 A | * 9/2000 | Mick et al. .................. 365/233 |
| 6,125,078 A | * 9/2000 | Ooishi et al. ............... 365/233 |

* cited by examiner

Primary Examiner—Do Hyun Yoo
Assistant Examiner—Kimberly McLean
(74) Attorney, Agent, or Firm—Schmeiser, Olsen & Watts; Robert A. Walsh

(57) ABSTRACT

An apparatus and method are provided that preserve data coherency within a DDR SRAM without sacrificing SRAM performance. The presence of a read-following-double-write (RFDW) condition is detected and data is prevented from being output from the SRAM following detection of the RFDW condition until coherent data is available. To detect an RFDW condition, preferably a double write signal is detected during a double write operation, and the double write signal is latched. A read signal also is detected during a read operation and the latched double write signal is compared to the read signal. If both the latched double write signal and the read signal are in a logic state that indicates that each is being performed, the RFDW condition is deemed detected. To prevent data from being pre-maturely output from the SRAM, the off chip driver circuitry of the SRAM preferably is maintained in a tri-state condition and data within a write buffer of the SRAM preferably is blocked until coherent data is available. A circuit for preserving data coherency in DDR SRAM circuitry is provided.

9 Claims, 2 Drawing Sheets

METHOD AND APPARATUS FOR PRESERVING DATA COHERENCY IN A DOUBLE DATA RATE SRAM

FIELD OF THE INVENTION

The present invention relates to double data rate (DDR) static random access memory (SRAM) circuitry and more particularly to a method and apparatus for preserving data coherency in a DDR SRAM.

BACKGROUND OF THE INVENTION

A DDR SRAM employs a data bus protocol in which data may be placed on a data bus twice per clock cycle (e.g., on both a rising and a falling edge of each clock cycle). More specifically, data from two addresses of the DDR SRAM may be read during a single clock cycle (i.e., a DDR read) and data may be written into two addresses of the DDR SRAM during a single clock cycle (i.e., a DDR write).

FIG. 1 is a timing diagram of a DDR write followed by a DDR read. With reference to FIG. 1, at time $t_0$, in response to a first rising edge of a clock signal ("CLK signal"), the SRAM address into which data "A" is to be written is sent to the SRAM via a memory controller. Thereafter, at time $t_1$, a first falling edge of the CLK signal occurs.

At time $t_2$, the data A is placed on the data bus via the memory controller and at time $t_3$, in response to the second rising edge of the CLK signal, the data A is written into a write buffer of the SRAM. Similarly, at time $t_4$ the data B is placed on the data bus via the memory controller and at time $t_5$, in response to the second falling edge of the CLK signal, the data B is written into a write buffer of the SRAM. Because of the time delay between when an address for data is sent to the SRAM and when the data is written to the SRAM, this type of SRAM is termed a "late write SRAM."

In addition to writing data A into the write buffer of the SRAM on the second rising edge of the CLK signal (time $t_3$), at time $t_3$ the address of the first data to be read from the SRAM is sent to the SRAM via the memory controller. Thereafter, in response to the third rising edge of the CLK signal (time $t_6$), the first data is read from the SRAM and is output by the SRAM onto the data bus at time $t_7$. Similarly, in response to the third falling edge of the CLK signal (time $t_8$), the second data is read from the SRAM and is output by the SRAM onto the data bus at time $t_9$. This form of a double write followed by a read (e.g., either a single or a double read) is termed a read-following-double-write (RFDW) operation.

FIG. 1 represents a special RFDW scenario wherein the data that is written to the write buffer of the SRAM on the second falling edge of the CLK signal (e.g., data B at time $t_5$) is the same data that is read from the SRAM on the third rising edge of the CLK signal (time $t_6$), from an address specified at time $t_3$. Thus, both the write operation and the read operation access the same SRAM address. Because the SRAM address for the data to be read is specified before the data has even been written to the SRAM, this form of RFDW presents special challenges. Specifically, ensuring that only the most current data (e.g., the data B written to the SRAM at time $t_5$) is output over the data bus during the read operation (i.e., ensuring that data coherency is maintained) is difficult without sacrificing DDR SRAM performance (e.g., by requiring the processor controlling the SRAM to maintain data coherency, by requiring a full clock cycle between a data write and a data read operation and/or by accepting glitched bus transitions).

Accordingly, a need exists for a method and apparatus for preserving data coherency within a DDR SRAM without sacrificing SRAM performance.

SUMMARY OF THE INVENTION

To address the needs of the prior art, an inventive apparatus and method are provided that preserve data coherency in a DDR SRAM without sacrificing SRAM performance. To preserve data coherency in a DDR SRAM, the presence of a read-following-double-write (RFDW) condition is detected, and data is prevented from being output from the SRAM following detection of the RFDW condition until coherent data is available. To detect an RFDW condition, preferably a double write signal is detected during a double write operation, and the double write signal is latched. A read signal also is detected during a read operation and the latched double write signal is compared to the read signal. If both the latched double-write signal and the read signal are in a logic state that indicates that each is being performed, the RFDW condition is deemed detected. To prevent data from being pre-maturely output from the SRAM, the off chip driver circuitry of the SRAM preferably is maintained in a tri-state condition and data within a write buffer of the SRAM preferably is blocked until coherent data is available.

A circuit for preserving data coherency in DDR SRAM circuitry is provided. The circuit comprises an RFDW detector adapted to detect an RFDW condition, and a data output blocking circuit coupled to the RFDW detector and adapted to prevent data from being output by the SRAM following detection of an RFDW condition until coherent data is available. The RFDW detector preferably comprises a latch adapted to latch a double write signal and a comparator adapted to compare the latched double write signal to a read signal. The data output blocking circuit preferably comprises a gating circuit adapted to block data output by the write buffer of the SRAM until coherent data is available.

Because data output from the SRAM's write buffer only is blocked until the data is coherent, data coherency is maintained without affecting performance. That is, data coherency and glitch-free data bus transitions are ensured without requiring the processor controlling the SRAM to maintain data coherency and without requiring a full clock cycle between a data write and a data read operation.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 2:
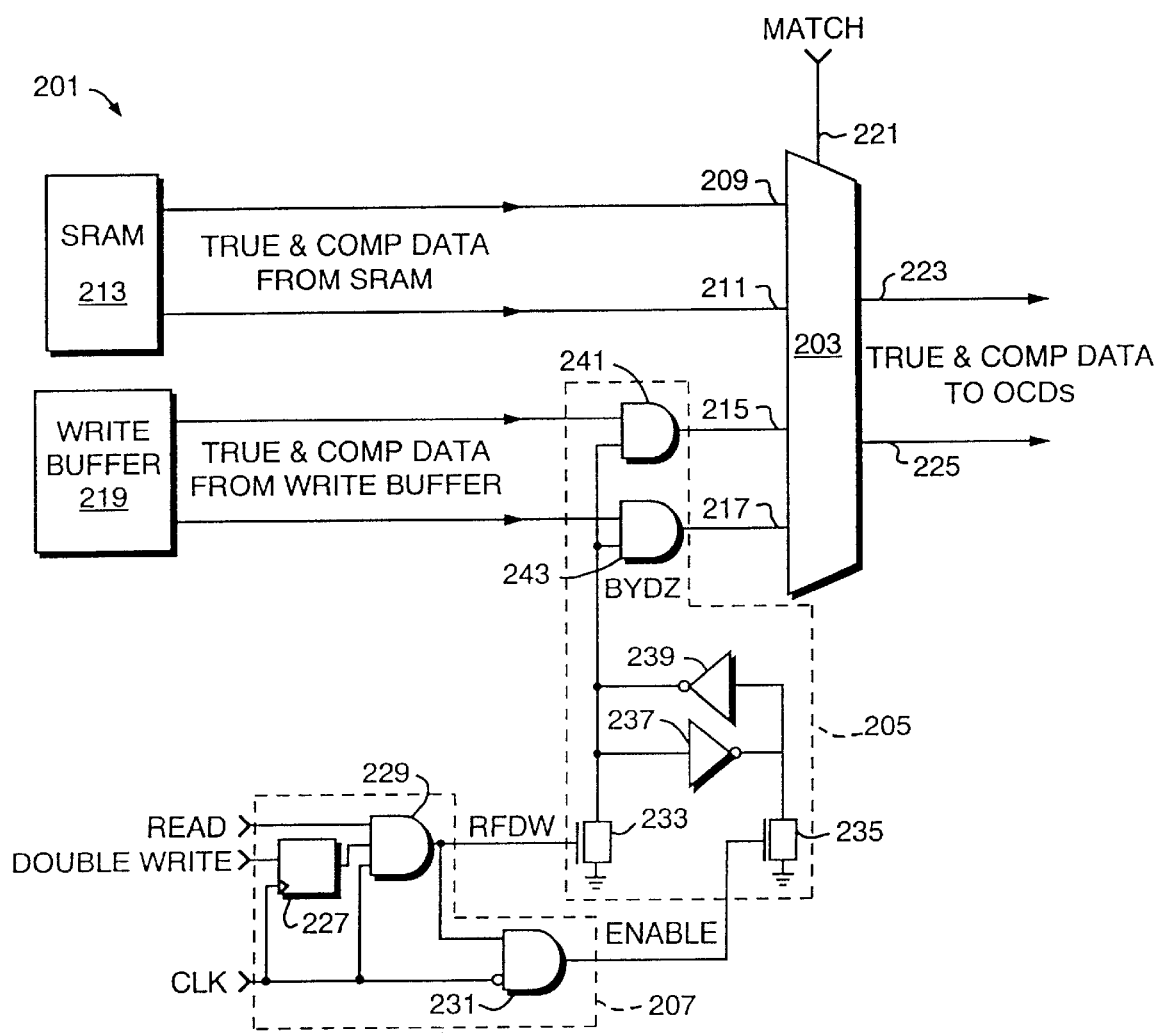
FIG. 2 is a schematic diagram of inventive DDR SRAM circuitry for preserving data coherency in accordance with the present invention.

FIG. 2 is a schematic diagram of inventive DDR SRAM circuitry 201 for preserving data coherency in accordance with the present invention. The inventive DDR SRAM circuitry 201 comprises a conventional match multiplexer 203 coupled to a data output blocking circuit 205, and an RFDW detector 207 coupled to the data output blocking circuit 205.

The match multiplexer 203 has a first input 209 and a second input 211 coupled to a true and a compliment output, respectively, of an SRAM array 213, and a third input 215 and a fourth input 217 coupled to a true and a compliment output, respectively, of a write buffer 219 via the data output blocking circuit 205 (as described below). The match multiplexer 203 further comprises a match input 221, and a true output 223 and a compliment output 225 that selectively output true and compliment data from either the SRAM array 213 or the write buffer 219 based on the voltage level (e.g., a match signal) input to the match input 221. For example, if a low logic level match signal (e.g., 0 volts) is supplied to the match input 221, data present on the first input 209 and on the second input 211 is output from the match multiplexer 203 via the true output 223 and the compliment output 225, respectively. If a high logic level (e.g., 1.8 volts) is supplied to the match input 221, data present on the third input 215 and on the fourth input 217 is output from the match multiplexer 203 via the true output 223 and the compliment output 225, respectively. Data output by the true output 223 and by the compliment output 225 is output to a data bus (not shown) via off chip driver circuitry (not shown) of the SRAM circuitry 201 as is known in the art.

The RFDW detector 207 comprises a latch 227 having an input for receiving a double write control signal from a memory controller (not shown) that controls the inventive DDR SRAM circuitry 201, and a clock input for receiving a CLK signal supplied by the memory controller (e.g., for clocking the latch 227 to latch the double write control signal into the latch 227 in response to a rising edge of the CLK signal). The RFDW detector 207 further comprises a first AND gate 229 having a first input for receiving a read control signal from the memory controller (not shown), a second input coupled to the output of the latch 227 and a is third input for receiving the CLK signal. The output of the first AND gate 229 serves as an RFDW signal (as described below). The RFDW detector 207 further comprises a second AND gate 231 having a first input coupled to the output of the first AND gate 229, a second, inverting input for receiving the CLK signal and an output.

The data output blocking circuit 205 comprises a first NFET 233 having a gate coupled to the output of the first AND gate 229 and a source coupled to ground, and a second NFET 235 having a gate coupled to the output of the second AND gate 231 and a source coupled to ground. The drains of the first NFET 233 and the second NFET 235 are coupled via a first inverter 237 and via a second inverter 239 as shown. The data output blocking circuit 205 further comprises a third AND gate 241 having a first input coupled to the true output of the write buffer 219, a second input coupled to the drain of the first NFET 233 and an output coupled to the third input 215 of the match multiplexer 203; and a fourth AND gate 243 having a first input coupled to the compliment output of the write buffer 219, a second input coupled to the drain of the first NFET 233 and an output coupled to the fourth input 217 of the match multiplexer 203.

In operation, when data is written to the SRAM array 213, the data is first cached into the write buffer 219 until a later clock cycle when the data can be written into the SRAM array 213. Thereafter, during subsequent data reads from the SRAM array 213, the address of the requested data must be compared to the address of the data stored within the write buffer 219 to determine the location of the most up-to-date data. Because the write buffer 219 always contains data that is more up-to-date than the data stored within the SRAM array 213, when the address of the requested data matches the address of the data stored within the write buffer 219, a match signal having a high logic level is supplied to the match multiplexer 203. In response thereto, the match multiplexer 203 outputs the data present on the third input 215 and on the fourth input 217 of the match multiplexer 203.

Assuming the read operation is not an RFDW operation, the data within the write buffer 219 is well settled prior to the read operation, and the data output blocking circuit 205 allows the data within the write buffer 219 to pass through the match multiplexer 203 in response to the high logic level match signal on the match input 221 (as described below). During an RFDW read operation, the requested data again must be compared to the address of the data stored within the write buffer 219, and if a match is found, a match signal having a high logic level is generated.

Figure 1:
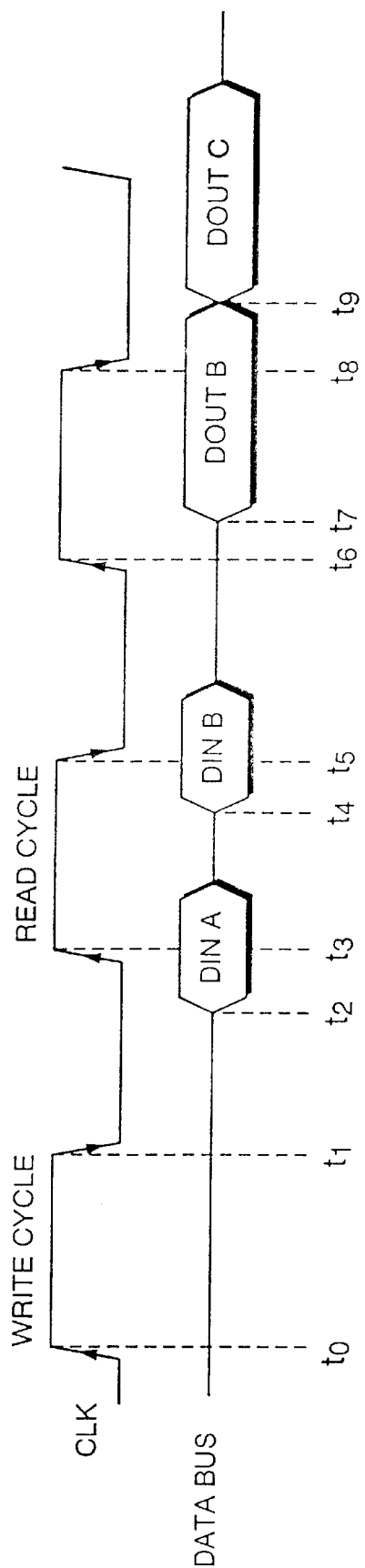
FIG. 1 is a timing diagram of a conventional DDR write followed by a DDR read, as previously described.

In conventional DDR SRAM circuitry, when the match signal goes high, the true and compliment data within the write buffer 219 is immediately passed through the match multiplexer 203 in response thereto. When the last data written to the write buffer 219 is the first data read therefrom (as described previously with reference to FIG. 1), the data written to the write buffer 219 does not have time to stabilize within the write buffer 219 prior to the match signal going high, and outdated write buffer data is passed through the match multiplexer 203 to the off chip drivers of the DDR SRAM circuitry. The outdated write buffer data thereby may be driven over the data bus and data bus glitches may result.

In the inventive DDR SRAM circuitry 201, when the match signal goes high during an RFDW operation, the true and compliment data within the write buffer 219 is not immediately passed through the match multiplexer 203 (despite the high logic level of the match signal on the match input 221). Rather, the data within the write buffer 219 is not passed through the match multiplexer 203 until after a time period sufficient to allow any data written to the write buffer 219 (in response to a previous falling edge CLK signal transition) to stabilize (e.g., until coherent data is available). In this manner, when the last data written to the write buffer 219 is the first data read therefrom (as described previously with reference to FIG. 1), the data written to the write buffer 219 has time to stabilize within the write buffer 219 before the data within the write buffer 219 is passed through the match multiplexer 203 to the off chip drivers of the inventive DDR SRAM circuitry 201. Outdated write buffer data thereby is not driven over the data bus and data bus glitches do not result.

With reference to FIG. 2, when a double write operation occurs within the inventive DDR SRAM circuitry 201, a double write control signal having a high logic level is suppled to the inventive DDR SRAM circuitry 201 (e.g., via a memory controller), and the double write control signal is latched into the latch 227. Thereafter, assuming the next clock cycle is a read cycle, a read control signal having a high logic level is generated by the memory controller and is supplied to the first input of the first AND gate 229, along with the high-logic-level, latched double write control signal and the CLK signal. A high logic level thereby is output by the first AND gate 229 (e.g., an RFDW signal) as described below with reference to FIG. 3.

Figure 3:
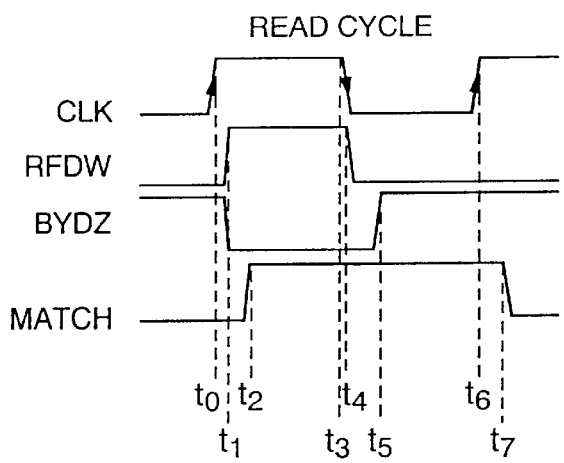
FIG. 3 is a timing diagram of the various signals generated within the read-following-double-write detector of the inventive DDR SRAM circuitry of FIG. 2.

FIG. 3 is a timing diagram of the various signals generated within the RFDW detector 207 during an RFDW operation within the inventive DDR SRAM circuitry 201. As shown in FIG. 3, at time $t_0$, in response to a rising edge of the CLK signal, a read cycle begins immediately following a double data write cycle (e.g., assume a high-logic-level, latched double write control signal is stored within the latch 227). With the read control signal, the latched double write control signal and the CLK signal all high, at time $t_1$, the output of the first AND gate 229 (RFDW) goes high, signifying that an RFDW condition has been detected.

With the output of the first AND gate 229 high, the first NFET 233 turns ON, and the drain of the first NFET 233 is pulled to ground. In response thereto, the second inputs of both the third AND gate 241 and the fourth AND gate 243 are pulled low (e.g., signal bypass data zero or "BYDZ" is pulled low in FIG. 3) and the outputs of both the third AND gate 241 and the fourth AND gate 243 are forced low.

At time $t_2$, a high logic level match signal is generated, indicating that the address of the data within the write buffer 219 matches the address of the data to be read from the SRAM array 213. With the match signal high, the match multiplexer 203 outputs the data present on the third input 215 and on the fourth input 217. However, unlike in conventional DDR SRAM circuitry wherein the data within the write buffer 219 is immediately output by the match multiplexer 203 when the match signal goes high, in the inventive DDR SRAM circuitry 201, the data output blocking circuit 205 forces the third input 215 and the fourth input 217 of the match multiplexer 203 low so that the data within the write buffer 219 is not output by the match multiplexer 203. Rather, both the true output 223 and the compliment output 225 of the match multiplexer 203 are forced low when the match signal goes high. With the true output 223 and the compliment output 225 both low, the off chip drivers (not shown) of the inventive DDR SRAM circuitry 201 remain in tristate, no erroneous data is driven over the data bus (not shown) and the data bus does not glitch when coherent data becomes available within the write buffer 219.

At time $t_3$, the CLK signal goes low and in response thereto, the output of the second AND gate 231 (enable) is forced high and the second NFET 235 turns ON. Approximately simultaneously therewith (at time $t_4$), the output of the first AND gate 229 goes low due to the low voltage of the CLK signal, and the first NFET 233 turns OFF. As the second NFET 235 turns ON, the input of the second inverter 239 is pulled low, and at time $t_5$ the output of the second inverter 239 (BYDZ) is driven high. In response thereto, the second inputs of the third AND gate 241 and the fourth AND gate 243 are pulled high so that the data within the write buffer 219, which has now stabilized and is coherent, is passed to the third input 215 and to the fourth input 217 of the match multiplexer 203. Because the match signal remains high, the data on the third input 215 and on the fourth input 217 is output from the match multiplexer 203 to the inventive DDR SRAM circuitry 201's off chip drivers (not shown). The data then is output to the data bus (not shown) in response to the next rising edge of the CLK signal (time $t_6$). At time $t_7$, the match signal goes low.

Because the data output blocking circuit 205 only blocks the data output by the write buffer 219 until the data is coherent, data coherency within the inventive DDR SRAM circuitry 201 is maintained without affecting performance. That is, data coherency and glitch-free data bus transitions are ensured without requiring the processor controlling the inventive DDR SRAM circuitry 201 to maintain data coherency and without requiring a full clock cycle between a data write and a data read operation.

The foregoing description discloses only the preferred embodiments of the invention, modifications of the above disclosed apparatus and method which fall within the scope of the invention will be readily apparent to those of ordinary skill in the art. For instance, while the particular logic gates described herein are preferred, functionally equivalent logic gates (e.g., NAND gates for AND gates or the like) may be similarly employed. Other comparator devices than the first AND gate 229 may be used for RFDW detection.

Accordingly, while the present invention has been disclosed in connection with the preferred embodiments thereof, it should be understood that other embodiments may fall within the spirit and scope of the invention, as defined by the following claims.

The invention claimed is:

1. A circuit for preserving data coherency in DDR SRAM circuitry employing a write buffer and a match multiplexor, the circuit comprising:
  read-following-double-write (RFDW) detector means for detecting a RFDW condition, the RFDW detector means comprising:
    latching means for latching a double write signal in response to a clock signal of the DDR SRAM circuitry; and
    comparator means coupled to the latching means for receiving a read signal, for comparing the read signal to the latched double write signal and for outputting a RFDW signal if the latched double write signal is in a logic state indicative of a double write operation being performed and if the read signal is in a logic state indicative of a read operation being performed; and
  data output blocking means coupled to the RFDW detector means for preventing data from being output by the SRAM following detection of a RFDW condition until coherent data is available, the data output blocking means comprising:
    gating means coupled to the RFDW detector means for maintaining at least one off chip driver of the SRAM circuitry in tri-state in response to the detection of the RFDW condition until coherent data is available.

2. A method for preserving data coherency in a DDR SRAM comprising:
  detecting a read-following-double-write (RFDW) condition; and
  preventing data from being output by the SRAM following detection of the RFDW condition by maintaining off chip driver circuitry of the SRAM in a tri-state condition until coherent data is available.

3. A method for preserving data coherency in a DDR SRAM comprising:
  detecting a read-following-double-write (RFDW) condition; and
  preventing data from being output by the SRAM following detection of the RFDW condition until coherent data is available by blocking data output from a write buffer of the SRAM and forcing a true and a compliment output of a match multiplexor to the same voltage level.

4. A method for preserving data coherency in a DDR SRAM comprising:
  detecting a read-following-double-write (RFDW) condition; and
  preventing data from being output by the SRAM following detection of the RFDW condition until coherent data is available by preventing data from being output to at least one off chip driver of the SRAM until the end of a read cycle.

5. A circuit for preserving data coherency in DDR SRAM circuitry comprising:

a read-following-double-write (RFDW) detector adapted to detect a RFDW condition; and a data output blocking circuit coupled to the RFDW detector and adapted to prevent data from being output by the SRAM following detection of a RFDW condition until coherent data is available, the data output blocking circuit comprising a gating circuit coupled to the RFDW detector and adapted to maintain at least one off chip driver of the SRAM circuitry in tri-state in response to the detection of the RFDW condition until coherent data is available.

6. A circuit for preserving data coherency in DDR SRAM circuitry, the DDR SRAM circuitry including a write buffer and a match multiplexer, comprising:

a read-following-double-write (RFDW) detector adapted to detect a RFDW condition; and a data output blocking circuit coupled to the RFDW detector and adapted to prevent data from being output by the SRAM following detection of a RFDW condition until coherent data is available, the data output blocking circuit comprising a gating circuit coupled to the RFDW detector and adapted to block data output by the write buffer in response to the detection of the RFDW condition until coherent data is available.

7. The circuit of claim 6 wherein the data output blocking circuit comprises:

a first gating device coupled to the RFDW detector and to the match multiplexer and adapted to block true data output by the write buffer in response to the detection of the RFDW condition until coherent data is available; and a second gating device coupled to the RFDW detector and to the match multiplexer and adapted to block complement data output by the write buffer in response to the detection of the RFDW condition until coherent data is available.

8. The circuit of claim 7 wherein the first gating device comprises a first circuit adapted to perform an AND function having a first input coupled to the RFDW detector, a second input coupled to a true data output of the write buffer and an output coupled to a first input of the match multiplexer and wherein the second gating device comprises a second circuit adapted to perform an AND function having a first input coupled to the RFDW detector, a second input coupled to a compliment data output of the write buffer and an output coupled to a second input of the match multiplexer.

9. The circuit of claim 8 further comprising a pull-down device coupled to the RFDW detector and to the first inputs of the first and the second circuits and adapted to pull the first inputs of the first and the second circuits low in response to the detection of the RFDW condition until coherent data is available.

\* \* \* \* \*